United States Patent
Ha et al.

(10) Patent No.: US 10,484,014 B2
(45) Date of Patent: Nov. 19, 2019

(54) CONTROLLER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Gwangju (KR); Su-Hwang Jeong, Jeollanam-do (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/602,255

(22) Filed: May 23, 2017

(65) Prior Publication Data

US 2018/0026661 A1    Jan. 25, 2018

(30) Foreign Application Priority Data

Jul. 21, 2016    (KR) .......................... 10-2016-0092551

(51) Int. Cl.
*H03M 13/15* (2006.01)
*H03M 13/00* (2006.01)
(Continued)

(52) U.S. Cl.
CPC ....... *H03M 13/152* (2013.01); *G06F 11/1072* (2013.01); *G11C 29/52* (2013.01);
(Continued)

(58) Field of Classification Search
CPC ............. H03M 13/152; H03M 13/616; H03M 13/2921; H03M 13/118; H03M 13/2906;
(Continued)

(56) References Cited

U.S. PATENT DOCUMENTS

| 7,590,914 B2 * | 9/2009 | Kim ................... H03M 13/1105 714/752 |
| 7,904,793 B2 * | 3/2011 | Mokhlesi ............ G11C 11/5642 714/780 |

(Continued)

FOREIGN PATENT DOCUMENTS

| KR | 101496052 | 2/2015 |
| KR | 1020150083291 | 7/2015 |

(Continued)

OTHER PUBLICATIONS

Kim, D. et al., Quasi-Primitive Block-Wise Concatenated BCH Codes With Collaborative Decoding for NAND Flash Memories, Oct. 2015, pp. 3482-3496, vol. 63, IEEE.

*Primary Examiner* — Phung M Chung
(74) *Attorney, Agent, or Firm* — IP & T Group LLP

(57) ABSTRACT

An operating method of a controller includes generating a square message matrix of k×k; and generating an encoded message by encoding the square message matrix row by row through a Bose-Chadhuri-Hocquenghem (BCH) code, wherein the square message matrix includes an upper triangular matrix and a lower triangular matrix, which are symmetrical to each other with reference to zero-padding blocks included in a diagonal direction in the square message matrix, wherein the upper triangular matrix includes "β" numbers of message blocks, each of which has a size of "α+1", and "(N−β)" numbers of message blocks, each of which has a size of "α", and wherein "α", "β" and N have relationships represented by equations 1 and 2:

$$\alpha = \left\lfloor \frac{M}{N} \right\rfloor \quad [\text{Equation 1}]$$

(Continued)

-continued $$\beta = M \bmod N \quad \text{[Equation 2]}$$

where "M" represents a size of a message input from a host and "N" represents a number of message blocks forming the upper triangular matrix.

16 Claims, 8 Drawing Sheets

(51) Int. Cl.
*G06F 11/10* (2006.01)
*G11C 29/52* (2006.01)
*H03M 13/29* (2006.01)
*G11C 29/04* (2006.01)

(52) U.S. Cl.
CPC ..... *H03M 13/2906* (2013.01); *H03M 13/611* (2013.01); *H03M 13/616* (2013.01); *G11C 2029/0411* (2013.01)

(58) Field of Classification Search
CPC ... H03M 13/2948; H03M 13/45; G11C 29/52; G11C 2029/0411; G06K 7/1473; G06F 11/1072; H04L 1/005; H04N 2201/328
See application file for complete search history.

(56) References Cited

U.S. PATENT DOCUMENTS

| | | | |
|---|---|---|---|
| 8,468,424 B2* | 6/2013 | Mokhlesi | G11C 11/5642 714/751 |
| 8,966,350 B2* | 2/2015 | Mokhlesi | G11C 11/5642 714/780 |
| 9,048,997 B2* | 6/2015 | Kim | H04L 1/0047 |
| 9,071,406 B2* | 6/2015 | Kim | H04L 1/0047 |
| 9,136,879 B2* | 9/2015 | Anholt | H03M 13/29 |
| 9,397,701 B1* | 7/2016 | Micheloni | H03M 13/13 |
| 9,813,080 B1* | 11/2017 | Micheloni | H03M 13/114 |
| 10,141,952 B2* | 11/2018 | Ha | H03M 13/15 |
| 2012/0221913 A1* | 8/2012 | Anholt | G06F 11/1012 714/752 |
| 2013/0132793 A1* | 5/2013 | Ha | H03M 13/2912 714/755 |
| 2013/0246720 A1* | 9/2013 | Mokhlesi | G11C 11/5642 711/154 |
| 2014/0149831 A1* | 5/2014 | Kim | H04L 1/0047 714/776 |
| 2016/0094246 A1* | 3/2016 | Vasista Srinivasan Ranganathan | H03M 13/1171 714/776 |
| 2016/0163382 A1* | 6/2016 | Conley | G11C 11/5642 365/185.03 |
| 2017/0272101 A1* | 9/2017 | Ha | H03M 13/6566 |

FOREIGN PATENT DOCUMENTS

| | | |
|---|---|---|
| KR | 1020150084560 | 7/2015 |
| KR | 1020150145738 | 12/2015 |

* cited by examiner

CONTROLLER, SEMICONDUCTOR MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2016-0092551, filed on Jul. 21, 2016, which is incorporated herein by reference in its entirety.

BACKGROUND

1. Field

Exemplary embodiments of the present invention relate to a controller performing an encoding operation with a symmetric block-wise concatenated Bose-Chadhuri-Hocquenghem (block-wise concatenated BCH) code, in which length differences of respective constituent codes and size differences of respective blocks are minimized, a semiconductor memory system and an operation method thereof.

2. Description of the Related Art

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing two or more bit data per cell is called a multi-level cell (MLC). An MLC storing 3-bit data per cell is also called a triple-level cell (TLC). MLCs are advantageous for high integration.

However, as the number of bits programmable into a single memory cell increases, the error rate of a memory during a read operation may worsen due to interference between the multiple levels. The error rate may become rather substantial as program and read operations are repeated, thereby reducing the overall reliability of the memory system. To solve this problem, memory systems employ an error correction code.

Heretofore, well-known error correction codes may include the hamming code, the Reed-Solomon code, and the Bose-Chaudhuri-Hocquenghem (BCH) code, and especially the block-wise concatenated BCH (BC-BCH) code comprising the BCH code as a constituent code. A symmetric block-wise concatenated BCH (SBC-BCH) code is a variation of the block-wise concatenated BCH (BC-BCH) code and is considered as a strong error correction code which has a high code rate and a low error rate. However, heretofore, there is no systematic design scheme of a message matrix for the symmetric block-wise concatenated BCH (SBC-BCH) code. For practical implementation of the symmetric block-wise concatenated BCH (SBC-BCH) code, a design scheme of a message matrix is required to minimize length differences of respective constituent codes and size differences of respective blocks. It is because decoding of the whole symmetric block-wise concatenated BCH (SBC-BCH) code is possible as well as the performance is improved through iteratively using a decoder of the same constituent code.

Therefore, what is needed is a systematic design scheme of a message matrix to minimize length differences of respective constituent codes and size differences of respective blocks.

SUMMARY

Various embodiments of the present invention are directed to a controller capable of performing an encoding operation with a symmetric block-wise concatenated Bose-Chadhuri-Hocquenghem (SBC-BCH) code, in which length differences of respective constituent codes and size differences of respective blocks are minimized, a semiconductor memory system employing the controller and an operation method thereof.

In accordance with an embodiment of the present invention, an operating method of a controller may include: generating a square message matrix of k×k; and generating an encoded message by encoding the square message matrix row by row through a Bose-Chadhuri-Hocquenghem (BCH) code, wherein the square message matrix includes an upper triangular matrix and a lower triangular matrix, which are symmetrical to each other with reference to zero-padding blocks included in a diagonal direction in the square message matrix, wherein the upper triangular matrix includes "β" numbers of message blocks, each of which has a size of "α+1", and "(N−β)" numbers of message blocks, each of which has a size of "α", and wherein "α", "β" and N have relationships represented by equations 1 and 2.

$$\alpha = \left\lfloor \frac{M}{N} \right\rfloor \quad \text{[Equation 1]}$$

$$\beta = M \bmod N \quad \text{[Equation 2]}$$

where "M" represents a size of a message input from a host and "N" represents a number of message blocks forming the upper triangular matrix.

Preferably, the generating of the encoded message may include selecting the "β" numbers of message blocks from message blocks included in an $(i)^{th}$ diagonal matrix group according to a sequential priority of the message blocks included in the $(i)^{th}$ diagonal matrix group, wherein the $(i)^{th}$ diagonal matrix group includes a $(i+1)^{th}$ diagonal matrix and a $(k+1-i)^{th}$ diagonal matrix, and wherein the "i" and "k" have a relationship represented by following equation 3.

$$1 \le i \le \left\lfloor \frac{k}{2} \right\rfloor \quad \text{[Equation 3]}$$

where "i" and "k" are integers.

Preferably, the message blocks included in the $(i)^{th}$ diagonal matrix group may have the sequence such that a message block included in the $(i+1)^{th}$ diagonal matrix has a sequentially higher priority than a message block included in the $(k+1-i)^{th}$ diagonal matrix, and such that a message block of higher row has a sequentially higher priority in a diagonal matrix, and wherein the generating of the encoded message includes, when the "β" numbers of message blocks are selected from the $(i)^{th}$ diagonal matrix group, selecting $(2*(n-1)*i+1)^{th}$ to $((2n-1)*i)^{th}$ message blocks prior to $((2n-1)*i+1)$ to $(2n*i)^{th}$ message blocks among message blocks included in the $(i)^{th}$ diagonal matrix group, where "n" is an integer greater than one (1).

Preferably, the generating of the encoded message may include selecting "γ" numbers of message blocks among the "β" numbers of message blocks from a $(k/2)^{th}$ diagonal matrix group when the "k" is even and the "β" satisfies following equation 4, and wherein the "γ", "β" and "k" have a relationship represented by following equation 5.

$$\beta \bmod k \leq \frac{k}{2} \qquad \text{[Equation 4]}$$

$$\gamma = \beta \bmod k \qquad \text{[Equation 5]}$$

Preferably, the generating of the encoded message may include generating a parity block for each row of the square message matrix, and wherein each size of the zero-padding blocks is the same as the parity block.

In accordance with an embodiment of the present invention, a controller may include: an error correction code encoding means suitable for generating a square message matrix of k×k, and generating an encoded message by encoding the square message matrix row by row through a Bose-Chadhuri-Hocquenghem (BCH) code, wherein the square message matrix includes an upper triangular matrix and a lower triangular matrix, which are symmetrical to each other with reference to zero-padding blocks included in a diagonal direction in the square message matrix, wherein the upper triangular matrix includes "β" numbers of message blocks, each of which has a size of "α+1", and "(N−β)" numbers of message blocks, each of which has a size of "α", and wherein the "α", "β" and "N" have relationships represented by following equations 1 and 2.

$$\alpha = \left\lfloor \frac{M}{N} \right\rfloor \qquad \text{[Equation 1]}$$

$$\beta = M \bmod N \qquad \text{[Equation 2]}$$

where the "M" represents a size of a message input from a host and the "N" represents a number of message blocks forming the upper triangular matrix.

Preferably, the error correction code encoding means may select the "β" numbers of message blocks from message blocks included in an $(i)^{th}$ diagonal matrix group according to a sequential priority of the message blocks included in the $(i)^{th}$ diagonal matrix group, wherein the $(i)^{th}$ diagonal matrix group includes a $(i+1)^{th}$ diagonal matrix and a $(k+1-i)^{th}$ diagonal matrix, and wherein the "i" and "k" have a relationship represented by following equation 3.

$$1 \leq i \leq \left\lfloor \frac{k}{2} \right\rfloor \qquad \text{[Equation 3]}$$

where "i" and "k" are integers.

Preferably, the message blocks included in the $(i)^{th}$ diagonal matrix group may have the sequence such that a message block included in the $(i+1)^{th}$ diagonal matrix has a sequentially higher priority than a message block included in the $(k+1-i)^{th}$ diagonal matrix, and such that a message block of higher row has a sequentially higher priority in a diagonal matrix, and wherein the error correction code encoding means selects, when the "β" numbers of message blocks are selected from the $(i)^{th}$ diagonal matrix group, $(2*(n-1)*i+1)^{th}$ to $((2n-1)*i)^{th}$ message blocks prior to $((2n-1)*i+1)$ to $(2n*i)^{th}$ message blocks among message blocks included in the $(i)^{th}$ diagonal matrix group, where "n" is an integer greater than one (1).

Preferably, the error correction code encoding means may select "γ" numbers of message blocks among the "β" numbers of message blocks from a $(k/2)^{th}$ diagonal matrix group when the "k" is even and the "β" satisfies following equation 4, and wherein the "γ", "β" and "k" have a relationship represented by following equation 5.

$$\beta \bmod k \leq \frac{k}{2} \qquad \text{[Equation 4]}$$

$$\gamma = \beta \bmod k \qquad \text{[Equation 5]}$$

Preferably, the error correction code encoding means may further generate a parity block for each row of the square message matrix, and wherein each size of the zero-padding blocks has the same as the parity block.

In accordance with an embodiment of the present invention, the operating method of a controller may include: reading from a memory device an encoded message including a square message matrix of k×k; and generating a decoded message by decoding the square message matrix row by row through a Bose-Chadhuri-Hocquenghem (BCH) code, wherein the square message matrix includes an upper triangular matrix and a lower triangular matrix, which are symmetrical to each other with reference to zero-padding blocks included in a diagonal direction in the square message matrix, wherein the upper triangular matrix includes "β" numbers of message blocks, each of which has a size of "α+1", and "(N−β)" numbers of message blocks, each of which has a size of "α", and wherein "α", "β" and N have relationships represented by following equations 1 and 2.

$$\alpha = \left\lfloor \frac{M}{N} \right\rfloor \qquad \text{[Equation 1]}$$

$$\beta = M \bmod N \qquad \text{[Equation 2]}$$

where "M" represents a size of the encoded message and "N" represents a number of message blocks forming the upper triangular matrix.

Preferably, the generating of the decoded message may include selecting the "β" numbers of message blocks from message blocks included in an $(i)^{th}$ diagonal matrix group according to a sequential priority of the message blocks included in the $(i)^{th}$ diagonal matrix group, wherein the $(i)^{th}$ diagonal matrix group includes a $(i+1)^{th}$ diagonal matrix and a $(k+1-i)^{th}$ diagonal matrix, and wherein the "i" and "k" have a relationship represented by following equation 3.

$$1 \leq i \leq \left\lfloor \frac{k}{2} \right\rfloor \qquad \text{[Equation 3]}$$

where "i" and "k" are integers.

Preferably, the message blocks included in the $(i)^{th}$ diagonal matrix group may have the sequence such that a message block included in the $(i+1)^{th}$ diagonal matrix has a sequentially higher priority than a message block included in the $(k+1-i)^{th}$ diagonal matrix, and such that a message block of higher row has a sequentially higher priority in a diagonal matrix, and wherein the generating of the encoded message includes, when the "β" numbers of message blocks are selected from the $(i)^{th}$ diagonal matrix group, selecting $(2*(n-1)*i+1)^{th}$ to $((2n-1)*i)^{th}$ message blocks prior to $((2n-1)*i+1)^{th}$ to $(2n*i)^{th}$ message blocks among message blocks included in the $(i)^{th}$ diagonal matrix group, where "n" is an integer greater than one (1).

Preferably, the generating of the decoded message may include selecting "γ" numbers of message blocks among the "β" numbers of message blocks from a $(k/2)^{th}$ diagonal matrix group when the "k" is even and the "P" satisfies following equation 4, and wherein the "γ", "β" and "k" have a relationship represented by following equation 5.

$$\beta \bmod k \le \frac{k}{2} \quad [\text{Equation 4}]$$

$$\gamma = \beta \bmod k \quad [\text{Equation 5}]$$

Preferably, each size of the zero-padding blocks may be the same as a parity block for each row of the square message matrix.

In accordance with an embodiment of the present invention, a controller may include: an error correction code decoding means suitable for reading from a memory device an encoded message including a square message matrix of k×k, and generating a decoded message by decoding the square message matrix row by row through a Bose-Chadhuri-Hocquenghem (BCH) code, wherein the square message matrix includes an upper triangular matrix and a lower triangular matrix, which are symmetrical to each other with reference to zero-padding blocks included in a diagonal direction in the square message matrix, wherein the upper triangular matrix includes "β" numbers of message blocks, each of which has a size of "α+1", and "(N−β)" numbers of message blocks, each of which has a size of "α", and wherein the "α", "β" and "N" have relationships represented by following equations 1 and 2.

$$\alpha = \left\lfloor \frac{M}{N} \right\rfloor \quad [\text{Equation 1}]$$

$$\beta = M \bmod N \quad [\text{Equation 2}]$$

where the "M" represents a size of the encoded message and the "N" represents a number of message blocks forming the upper triangular matrix.

Preferably, the error correction code decoding means may select the "β" numbers of message blocks from message blocks included in an $(i)^{th}$ diagonal matrix group according to a sequential priority of the message blocks included in the $(i)^{th}$ diagonal matrix group, wherein the $(i)^{th}$ diagonal matrix group includes a $(i+1)^{th}$ diagonal matrix and a $(k+1-i)^{th}$ diagonal matrix, and wherein the "i" and "k" have a relationship represented by following equation 3.

$$1 \le i \le \left\lfloor \frac{k}{2} \right\rfloor \quad [\text{Equation 3}]$$

where "i" and "k" are integers.

Preferably, the message blocks included in the $(i)^{th}$ diagonal matrix group may have the sequence such that a message block included in the $(i+1)^{th}$ diagonal matrix has a sequentially higher priority than a message block included in the $(k+1-i)^{th}$ diagonal matrix, and such that a message block of higher row has a sequentially higher priority in a diagonal matrix, and wherein the error correction code decoding means selects, when the "β" numbers of message blocks are selected from the $(i)^{th}$ diagonal matrix group, $(2*(n-1)*i+1)^{th}$ to $((2n-1)*i)^{th}$ message blocks prior to $((2n-1)*i+1)^{th}$ to $(2n*i)^{th}$ message blocks among message blocks included in the $(i)^{th}$ diagonal matrix group, where "n" is an integer greater than one (1).

Preferably, the error correction code decoding means may select "γ" numbers of message blocks among the "β" numbers of message blocks from a $(k/2)^{th}$ diagonal matrix group when the "k" is even and the "β" satisfies following equation 4, and wherein the "γ", "β" and "k" have a relationship represented by following equation 5.

$$\beta \bmod k \le \frac{k}{2} \quad [\text{Equation 4}]$$

$$\gamma = \beta \bmod k \quad [\text{Equation 5}]$$

Preferably, each size of the zero-padding blocks may be the same as a parity block for each row of the square message matrix.

In accordance with an embodiment of the present invention, it is possible to perform an encoding operation to a message with a symmetric block-wise concatenated Bose-Chadhuri-Hocquenghem (SBC-BCH) code, in which length differences of respective constituent codes and size differences of respective blocks are minimized, a semiconductor memory system and an operation method thereof.

BRIEF DESCRIPTION OF THE DRAWINGS

These and other features and/or advantages of the present invention will become apparent to those skilled in the art to which this invention pertains in view of the following description of various embodiments of the present invention in reference to the accompanying drawings in which.

DETAILED DESCRIPTION

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete and will fully convey the present invention to those skilled in the art. The drawings are not necessarily to scale and in some instances, proportions may have been exaggerated in order to clearly illustrate features of the embodiments. Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In general, a nonvolatile memory device such as a flash memory device includes a plurality of memory blocks, each of which is a unit of erase operation. Each memory block has pages, each of which is a unit of read and write operations. Therefore, it is preferable to perform the error correction operation with an error correction code by a unit of page. In general, in a typical flash memory, a size of the page may be 1 KB in a single level cell (SLC) structure, and 4 KB or 8 KB in a multi-level cell (MLC) structure.

A flash memory device as a storage device requires high reliability, and should operate at a very low error rate when an error correction code is applied. Also, a flash memory device has a limited delay time and complexity for any encoding and decoding operations for achieving fast read and write speeds. Also, a flash memory device has a limited ratio of parity bits to a whole storage data due to a limited extra space other than data storage space for efficiency of the storage space. Therefore, an error correction code suitable for a flash memory device should have a high code rate (e.g., over 0.9), and should not cause an error floor, or if causing an error floor, should have sufficiently short delay time and low complexity for overcoming the error floor.

Hereinafter, various embodiments of the present invention may be applied to a concatenated BCH code having a BCH code as a constituent code or a single BCH code. Hereinafter, various embodiments of the present invention will be described with the concatenated BCH code. The concatenated BCH code may be a block-wise concatenated BCH (BC-BCH) code.

Hereinafter, various embodiments of the present invention will be described with reference to the accompanying figures.

Figure 1:
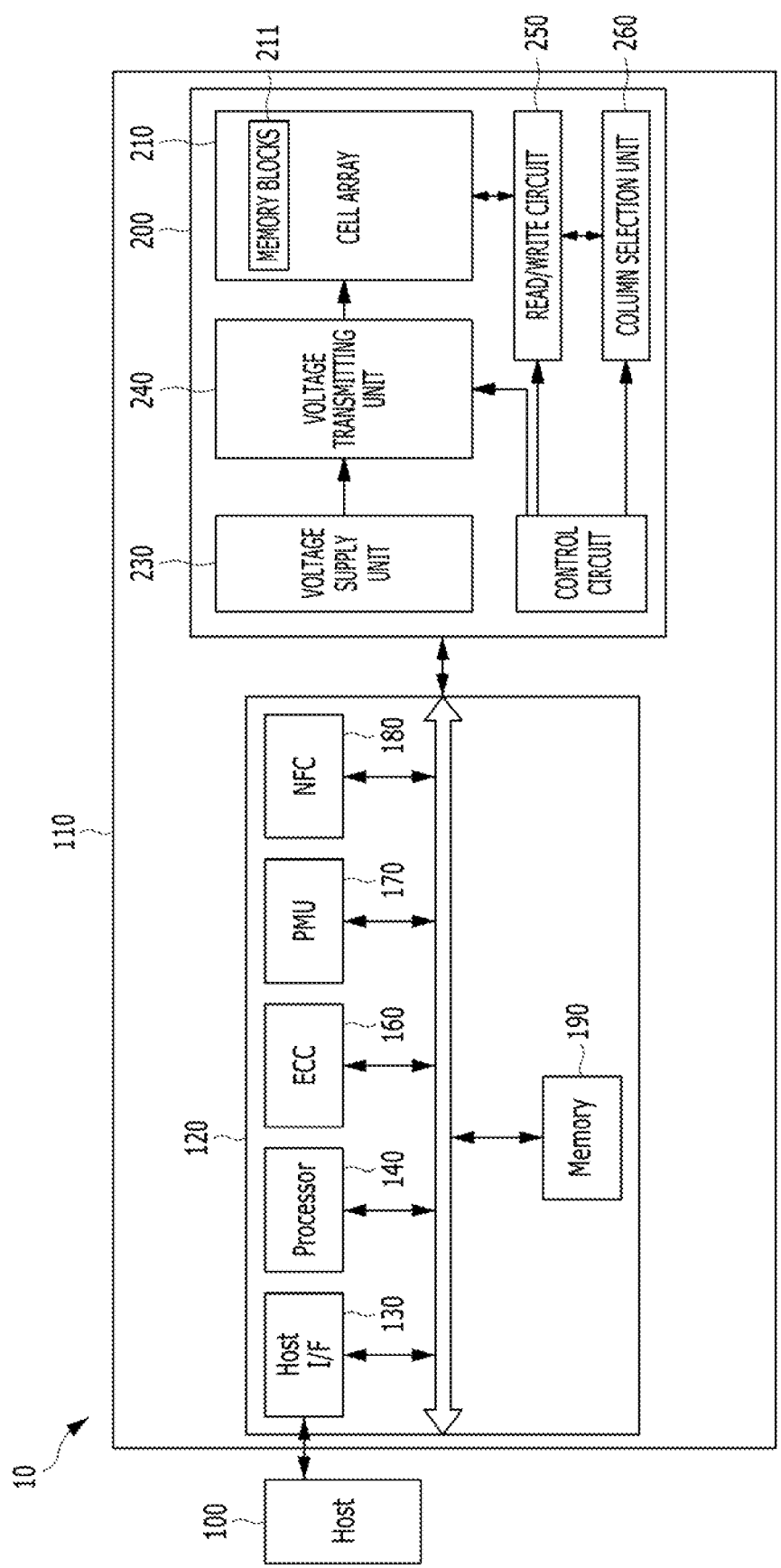
FIG. 1 is a block diagram illustrating a semiconductor memory system, in accordance with an embodiment of the present invention.

FIG. 1 illustrates a data processing system 10 including a semiconductor memory system 110, in accordance with an embodiment of the present invention.

According to the embodiment of FIG. 1, the data processing system 10 may also include a host 100 operatively coupled to the memory system 110.

The host 100 may include, for example, a portable electronic device, such as a mobile phone, an MP3 player, and a laptop computer or a non-portable electronic device such as a desktop computer, a game player, a television (TV), a projector and the like.

The memory system 110 may operate in response to a request of the host 100. The memory system 110 may store data to be accessed by the host 100. For example, the memory system 110 may be used as a main memory system or an auxiliary memory system of the host 100. The memory system 110 may be implemented with any one of various storage devices, according to the protocol of a host interface to be electrically coupled with the host 100. The memory system 110 may be implemented with any one of storage devices, such as, for example, a solid-state drive (SSD), a multimedia card (MMC), an embedded MMC (eMMC), a reduced-size MMC (RS-MMC) and a micro-MMC, a secure digital (SD) card, a mini SD card, a micro SD card, a universal serial bus (USB) storage device, a universal flash storage (UFS) device, a compact flash (CF) card, a smart media (SM) card, a memory stick, and the like.

The storage device for the memory system 110 may be implemented with a volatile memory device, such as, for example, a dynamic random access memory (DRAM) and a static random access memory (SRAM). The storage device for the memory system 110 may be implemented with a nonvolatile memory device, such as, for example, a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM), and the like. One or more storage devices may be used.

The memory system 110 may include a memory device 200 which may store data to be accessed by the host 100, and a controller 120 for controlling the operations of the memory device 200 including storage of data received from the host 100 to the memory device 200.

The controller 120 and the memory device 200 may be integrated into a semiconductor device configured as a memory card. For instance, the controller 120 and the memory device 200 may be integrated into a semiconductor device configured as a solid-state drive (SSD). When the memory system 110 is used as a SSD, the operation speed of the host 100 that is electrically coupled with the memory system 110 may be significantly increased.

The controller 120 and the memory device 200 may be integrated into a semiconductor device configured as a memory card. For example, the controller 120 and the memory device 200 may be integrated into a semiconductor device configured as any one of a memory card, such as, for example, a personal computer memory card international association (PCMCIA), a compact flash (CF) card, a smart media (SM) card (SMC), a memory stick, a multimedia card (MMC), a reduced-size (RS)MMC, a micro-MMC, a secure digital (SD) card, a mini-SD SD card, a micro-SD card, a secure digital high capacity (SDHC), a universal flash storage (UFS) device, and the like.

In an embodiment, the memory system 110 may be or include a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system, and the like.

The memory device 200 of the memory system 110 may retain stored data even when power supply is interrupted. The memory device 200 may store the data provided from the host 100 through a write operation, and provide stored data to the host 100 through a read operation.

The semiconductor memory device 200 may include a memory cell array 210, a control circuit 220, a voltage supply unit 230, a voltage transmitting unit 240, a read/write circuit 250, and a column selection unit 260.

For example, the semiconductor memory device 200 may be a nonvolatile memory device such as a flash memory device. The flash memory device may have a 3-dimensional (3D) stacked structure.

The memory cell array 210 may include a plurality of memory blocks 211. User data may be stored in the memory block 211.

The control circuit 220 may control the overall operations related to program, erase, and read operations of the semiconductor memory device 200.

The voltage supply unit 230 may provide word line voltages, for example, a program voltage, a read voltage, and a pass voltage, to the respective word lines according to an operation mode. The voltage supply unit 230 may provide a voltage to be supplied to a bulk (e.g., a well region), in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside (e.g., to the memory controller 100) based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) corresponding to the columns (or the bit lines) or column pairs (or bit line pairs), respectively. A plurality of latches may be included in each of the page buffers.

The controller 120 of the memory system 110 may control the memory device 200 in response to a request from the host 100. The controller 120 may provide the data read from the memory device 200, to the host 100. The controller 120 may store the data from the host 100 into the memory device 200. To this end, the controller 120 may control the overall operations such as, for example, read, write, program and erase operations of the memory device 200.

The controller 120 may include a host interface unit 130, a processor 140, an error correction code (ECC) unit 160, a power management unit (PMU) 170, a NAND flash controller (NFC) 180, and a memory 190.

The host interface 130 may process a command and data from the host 100 and may communicate with the host 100 through at least one of various interface protocols, such as, for example, a universal serial bus (USB), a multi-media card (MMC), a peripheral component interconnect express (PCI-E), a serial-attached SCSI (SAS), a serial advanced technology attachment (SATA), a parallel advanced technology attachment (PATA), a small computer system interface (SCSI), an enhanced small disk interface (ESDI), an Integrated drive electronics (IDE), and the like.

The ECC unit 160 may detect and correct errors in data read from the memory device 200 during the read operation. The ECC unit 160 may perform the ECC decoding on the data read from the memory device 200, determine whether or not the ECC decoding succeeds, output an instruction signal according to the determination result, and correct error bits of the read data using parity bits generated during the ECC encoding. The ECC unit 160 may not correct error bits when the number of the error bits is greater than a threshold number of correctable error bits, and may output an error correction fail signal indicating failure in correcting the error bits.

The ECC unit 160 may perform an error correction operation based on any one of a coded modulation, such as, for example, a low density parity check (LDPC) code, a Bose-Chaudhuri-Hocquenghem (BCH) code, a turbo code, a Reed-Solomon (RS) code, a convolution code, a recursive systematic code (RSC), a Trellis-coded modulation (TCM), a block coded modulation (BCM), and the like. The ECC unit 160 may include all circuits, systems or devices needed for the error correction operation.

The PMU 170 may provide and manage power for the controller 120. For example, the PMU 170 may provide and manage power for the component elements included in the controller 120. The PMU unit 170 may include all circuits, systems or devices needed.

The NFC 180 may serve as a memory interface between the controller 120 and the memory device 200 to allow the controller 120 to control the memory device 200 in response to a request from the host 100. The NFC 180 may generate control signals for the memory device 200 and process data under the control of the processor 140 when the memory device 200 is a flash memory and, in particular, when the memory device 200 is a NAND flash memory. Any suitable memory interface may be employed depending upon the particular memory device 200.

The memory 190 may serve as a working memory of the memory system 110 and the controller 120, and store data for driving the memory system 110 and the controller 120. The controller 120 may control the memory device 200 in response to a request from the host 100. For example, the controller 120 may provide the data read from the memory device 200 to the host 100, and may store the data provided from the host 100 in the memory device 200. When the controller 120 controls the operations of the memory device 200, the memory 190 may store data used by the controller 120 and the memory device 200 for such operations as read, write, program and erase operations.

The memory 190 may be implemented with a volatile memory. For example, the memory 144 may be implemented with a static random access memory (SRAM) or a dynamic random access memory (DRAM). As described above, the memory 190 may store data used by the host 100 and the memory device 200 for the write and read operations. To store data, the memory 190 may include a program memory, a data memory, a write buffer, a read buffer, a map buffer, and the like.

Additionally, the memory 190 may store data for operations between the ECC unit 160 and the processor 140, such as, for example, data that is read during read operations. That is, the memory 190 may store data read from the semiconductor memory device 200. The data may include user data, parity data and status data. The status data may include information of which cycling group is applied to the memory blocks 210 of the semiconductor memory device 200 during the program operation.

The processor 140 may control the operations of the memory system 110, and a write operation or a read operation for the memory device 200, in response to a write request or a read request from the host 100. The processor 140 may drive firmware, which is referred to as a flash translation layer (FTL), to control the general operations of the memory system 110. The processor 140 may be implemented with a microprocessor or a central processing unit (CPU).

Figure 2:
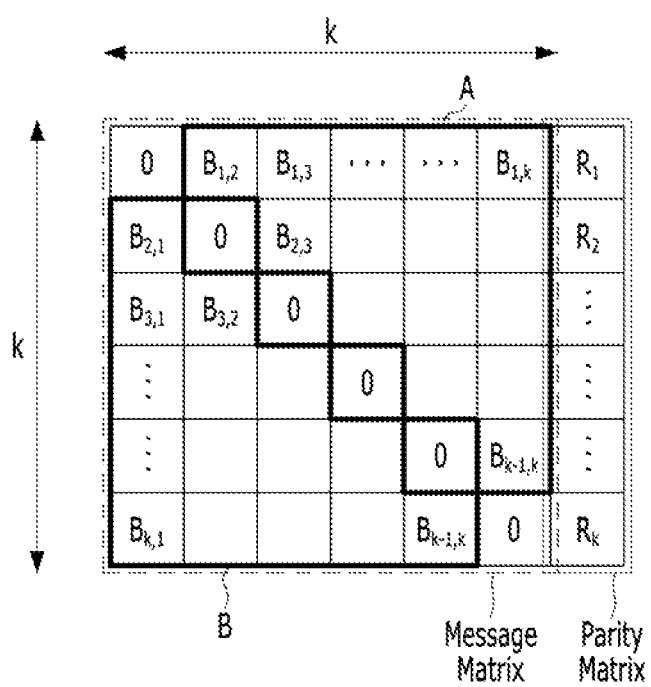
FIG. 2 is a diagram illustrating an SBC-BCH code having a symmetrical structure.

FIG. 2 is a diagram Illustrating a symmetric block-wise concatenated BCH (SBC-BCH) code, in accordance with an embodiment of the present invention.

Referring to FIG. 2, a matrix comprising constituent codes of the SBC-BCH code may include a message matrix MM, which is generated from a message, and a parity matrix PM generated as concatenated to the message matrix MM.

The message matrix MM of the SBC-BCH code may be a square matrix including an upper triangular matrix A including a plurality of message blocks, a lower triangular matrix B symmetrical to the upper triangular matrix A, and a plurality of zero-padding blocks on the boundary between the upper triangular matrix A and the lower triangular matrix B. The plurality of zero-padding blocks may be a plurality of diagonal message blocks $B_{i,j}$, where i=j, that is, a plurality of message blocks included in a $1^{st}$ diagonal matrix starting from a message block $B_{1,1}$, of the $1^{st}$ row and the $1^{st}$ column among the plurality of message blocks $B_{i,j}$ in the message matrix MM.

A message block $B_{i,j}$ included in the upper triangular matrix A may have the same message as the message block $B_{j,i}$ included in the lower triangular matrix B. That is, the message blocks $B_{i,j}$ and $B_{j,i}$ may have the same size and contents. For example, the message block $B_{1,2}$ included in the upper triangular matrix A may have the same message as the message block $B_{2,1}$ included in the lower triangular matrix B. Here, "i" and "j" are integers greater than one (1) and smaller than "k" representing a number of rows or columns, respectively, of the message matrix MM.

In this disclosure, an $(i)^{th}$ diagonal matrix is defined as an array of message blocks of an $(i)^{th}$ diagonal in a square message matrix, wherein, taking the message matrix MM as an example, an $(i)^{th}$ diagonal is defined as a diagonal parallel to an array of the plurality of zero-padding blocks and starting from a message block $B_{1,i}$ in the message matrix MM. For example, a $2^{nd}$ diagonal may represent a diagonal parallel to an array of the plurality of zero-padding blocks and starting from a message block $B_{1,2}$ in the message matrix MM.

An $(i)^{th}$ parity block $R_i$ may include a parity information for message blocks $B_{i,1}$ to $B_{i,k}$ of an $(i)^{th}$ row in the message matrix MM. For example, a parity block $R_1$ may include the parity information for message blocks $B_{1,1}$ to $B_{1,k}$ of a $1^{st}$ row in the message matrix MM, and parity block $R_3$ may include the parity information for message blocks $B_{3,1}$ to $B_{3,k}$ of a $3^{rd}$ row in the message matrix MM.

The message blocks $B_{i,1}$ to $B_{i,k}$ of the $(i)^{th}$ row and the $(i)^{th}$ parity block $R_i$ of the $(i)^{th}$ row in the SBC-BCH code matrix may form an $(i)^{th}$ constituent code $C_i$. For example, message blocks $B_{1,1}$ to $B_{1,k}$ and a parity block $R_1$ of a $1^{st}$ row may form a $1^{th}$ constituent code $C_1$, and message blocks $B_{k,1}$ to $B_{k,k}$ and a parity block $R_k$ of a $(k)^{th}$ row may form a $(k)^{th}$ constituent code $C_k$. Here, a number of the constituent codes may be "k", which is the same as a number of rows of the message matrix MM.

Since the message block $B_{i,j}$ of the $(i)^{th}$ constituent code $C_i$ may be the same as the message block $B_{j,i}$ of the $(j)^{th}$ constituent code $C_j$, the $(i)^{th}$ constituent code $C_i$ may have at least one message block, which is the same as one included in the $(j)^{ht}$ constituent code $C_j$. For example, a $1^{st}$ constituent code $C_1$ may have a message block $B_{1,2}$, which is the same as the message block $B_{2,1}$ of a $2^{nd}$ constituent code $C_2$.

In the message matrix MM, a total length of messages included in the upper triangular matrix A or the lower triangular matrix B may be "K", a number of message blocks may be "$N_B$" in the upper triangular matrix A or the lower triangular matrix B, a number of bits included in each message block $B_{i,j}$ (i.e., the size of each message block $B_{i,j}$) may be "$n_B$", and a number of constituent codes may be "k".

The number "$N_B$" of message blocks included in the upper triangular matrix A or the lower triangular matrix B of the message matrix MM may be represented by the following equation 1.

$$N_B = \frac{(k-1) \times k}{2} \qquad \text{[Equation 1]}$$

Wherein k is the number of rows and columns of the message matrix. Hence, for example, for a message matrix having three columns and three rows, the number of message blocks in the upper or the lower triangular matrices A and B may be three. The total length "K" of messages included in the upper triangular matrix A or the lower triangular matrix B in the message matrix MM may be represented by the following equation 2.

$$K = \alpha \times N_B + \beta \qquad \text{[Equation 2]}$$

In equation 2, "α" may represent a quotient (i.e., $\lfloor K/N_B \rfloor$) and "β" may represent a remainder (i.e., K mod $N_B$) when dividing the total length "K" of messages included in the upper triangular matrix A or the lower triangular matrix B by the number "$N_B$" of message blocks included in the upper triangular matrix A or the lower triangular matrix B of the message matrix MM. Here, "β" may satisfy the following equation 3.

$$0 \leq \beta \leq N_B \qquad \text{[Equation 3]}$$

That is, "β" may have a value greater than zero (0) and smaller than the number "$N_B$" of the message blocks included in the upper triangular matrix A or the lower triangular matrix B of the message matrix MM.

Therefore, according to equations 1 to 3, when "β" has a non-zero value, the size "$n_B$" of each message block $B_{i,j}$ may be different from one another. For example, the size "$n_B$" of each message block $B_{i,j}$ may be "α" or "α+1".

When the size "$n_B$" of each message block $B_{i,j}$ differs greatly, the length of each constituent code may also differ greatly and thus the error correction capability of the SBC-BCH code may be degraded or the complexity of implementing of the SBC-BCH code may increase.

Therefore, a design scheme of a message matrix is required that minimizes differences in the size "$n_B$" of each message block $B_{i,j}$ and in the length of each constituent code even when "β" has a non-zero value. That is, a design scheme of a message matrix is required to minimize the difference in the size "$n_B$" of each message block $B_{i,j}$ and in the length of each constituent code by selecting "β" number of message blocks, by setting each size of the "β" number of selected message blocks to have a value of "α+1", and setting each size of remaining message blocks to have a value of "α".

Hereinafter, described with reference to FIGS. 3 to 5 will be a design scheme of a message matrix that minimizes the differences in the size "$n_B$" of each message block $B_{i,j}$ and in the length of each constituent code even when "β" has a non-zero value.

Figure 3:
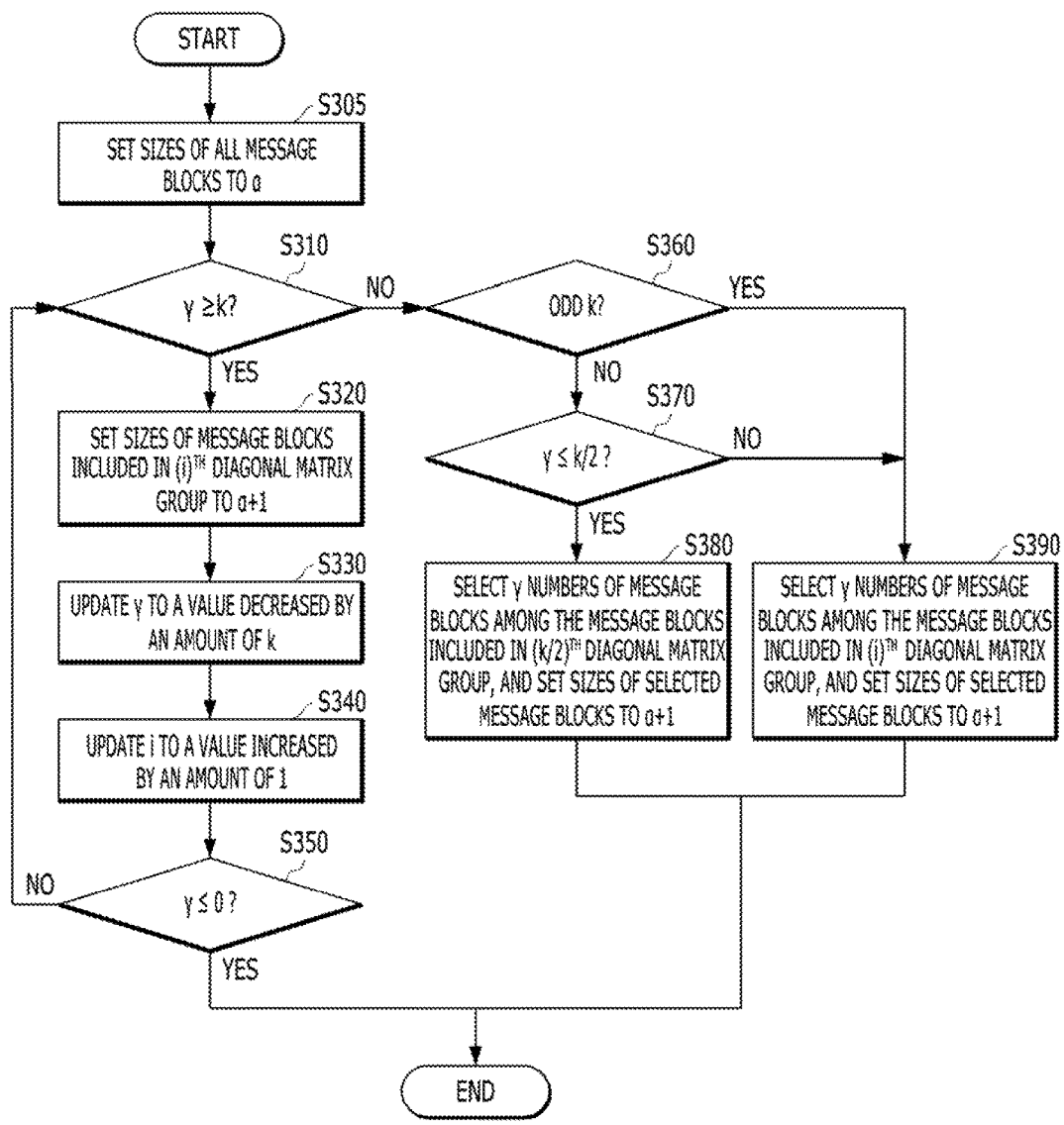
FIG. 3 is a flowchart illustrating an operation of setting sizes of respective message blocks included in an upper triangular matrix of a message matrix.

FIG. 3 is a flowchart illustrating an operation of setting sizes of respective message blocks $B_{i,j}$ included in the upper triangular matrix A of the message matrix MM.

At step S305, the controller 120 may set each size of all of the message blocks to have a value of "α". Here, "α" may represent a quotient when dividing the total length "K" of messages included in the upper triangular matrix A or the lower triangular matrix B by the number "$N_B$" of message blocks included in the upper triangular matrix A or the lower triangular matrix B of the message matrix MM.

At step S310, the controller 120 may determine whether a remainder "γ" is equal to or greater than "k". When the remainder "γ" is equal to or greater than "k" as a result of the determination ("YES" at step S310), the operation may proceed to step S320. When the remainder "γ" is not greater than "k" as a result of the determination ("NO" at step S310), the operation may proceed to step S360. Here, an initial value of the remainder "γ" may be "β", "k" may represent the number of constituent codes, and "β" may represent a remainder when dividing the total length "K" of messages included in the upper triangular matrix A or the lower triangular matrix B by the number "$N_B$" of message blocks included in the upper triangular matrix A or the lower triangular matrix B of the message matrix MM.

At step S320, the controller 120 may set each size of message blocks included in an (i)$^{th}$ diagonal matrix group $G_i$ to have a value of "α+1".

The (i)$^{th}$ diagonal matrix group $G_i$ may include an (i+1)$^{th}$ diagonal matrix starting from a message block $B_{1, i+1}$ located in a 1$^{st}$ row of an (i+1)$^{th}$ column of a matrix and an (k+1-i)$^{th}$ diagonal matrix starting from a message block $B_{1, k+1-i}$ located in the 1$^{st}$ row of an (k+1-i)$^{th}$ column of the matrix. Here, "i" may be an integer greater than one (1) and smaller than "k/2". Accordingly, each diagonal matrix group $G_i$ may have "k" numbers of message blocks when the number "k" of constituent codes is odd. Further, (k/2)$^{th}$ diagonal matrix group $G_i$ may have "k/2" numbers of message blocks and each of the other diagonal matrix groups may have "k" numbers of message blocks when the number "k" of constituent codes is even. For example, when the number of constituent codes is six (6) (i.e., k=6), a 1$^{st}$ diagonal matrix group $G_1$ may include a 2$^{nd}$ diagonal matrix starting from a message block $B_{1,2}$ located in a 1$^{st}$ of a 2$^{nd}$ column and a 6$^{th}$ diagonal matrix starting from a message block $B_{1,6}$ located in a 1$^{st}$ of a 6$^{th}$ column. In other words, the 1$^{st}$ diagonal matrix group $G_1$ may include the 2$^{nd}$ diagonal matrix of message blocks $B_{1,2}$, $B_{2,3}$, $B_{3,4}$, $B_{4,5}$ and $B_{5,6}$, and the 6$^{th}$ diagonal matrix of a message block $B_{1,6}$. In similar manner, a 2$^{nd}$ diagonal matrix group $G_2$ may include a 3$^{rd}$ diagonal matrix of message blocks $B_{1,3}$, $B_{2,4}$, $B_{3,5}$ and $B_{4,6}$, and a 5$^{th}$ diagonal matrix of message blocks $B_{1,5}$ and $B_{2,6}$. A 3$^{rd}$ diagonal matrix group $G_3$ may include a 4$^{th}$ diagonal matrix of message blocks $B_{1,4}$, $B_{2,5}$ and $B_{3,6}$.

Following step S320, at step S330, the controller 120 may update the remainder "γ" and may decrease the value of the remainder "γ" by an amount of "k".

At step S340, the controller 120 may update (i) to a value increased by one (1).

At step S350, the controller 120 may determine whether the remainder "γ" is equal to or smaller than zero (0). The controller 120 may end the process when the remainder "γ" is determined to be equal or smaller than zero (0) ("YES" at step S350), or may proceed to step S310 when the remainder "γ" is determined to exceed zero (0) ("NO" at step S350).

At step S360, the controller 120 may determine whether or not the number "k" of constituent codes is odd. The controller 120 may proceed to step S370 when the number "k" of constituent codes is determined to be even ("NO" at step S360), or may proceed to step S390 when the number "k" of constituent codes is determined as odd ("YES").

At step S370, the controller 120 may determine whether the remainder "γ" is equal to or smaller than "k/2", and may proceed to step S380 when the remainder "γ" is determined to be equal to or smaller than "k/2" ("YES"), or may proceed to step S390 when the remainder "γ" is determined to exceed "k/2" ("NO").

At step S380, the controller 120 may select "γ" numbers of message blocks among the message blocks included in the (k/2)$^{th}$ diagonal matrix group, and may set each size of the selected message blocks to have a value of "α+1".

At step S390, the controller 120 may select "γ" numbers of message blocks among the message blocks included in the (i)$^{th}$ diagonal matrix group, and may set each size of the selected message blocks to have a value of "α+1".

Figure 4:
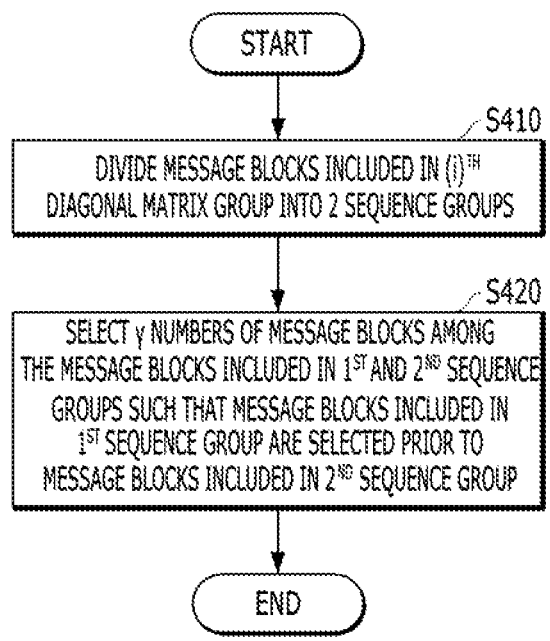
FIG. 4 is a flowchart illustrating an operation of selecting "γ" numbers of message blocks among message blocks included in an $(i)^{th}$ diagonal matrix group.

FIG. 4 is a flowchart illustrating an operation of selecting "γ" numbers of message blocks among the message blocks included in an (i)$^{th}$ diagonal matrix group.

At step S410, the controller 120 may divide the message blocks included in the (i)$^{th}$ diagonal matrix group $G_i$ into two (2) sequence groups. Here, the message blocks included in a 1$^{st}$ sequence group of the (i)$^{th}$ diagonal matrix group $G_1$ may be $(2*(n-1)*i+1)^{th}$ to $((2n-1)*i)^{th}$ message blocks, and the message blocks included in a 2$^{nd}$ sequence group of the (i)$^{th}$ diagonal matrix group $G_i$ may be $((2n-1)*i+1)$ to $(2n*i)^{th}$ message blocks, wherein "n" is an Integer greater than one (1).

The sequence of the message blocks included in each diagonal matrix may be set such that message blocks included in a (i+1)$^{th}$ diagonal matrix have a sequentially higher priority than message blocks included in a (k+1-i)$^{th}$ diagonal matrix, and such that a message block of a higher row (e.g., a first row is defined as higher than a second row in a matrix) has a sequentially higher priority in a diagonal matrix.

For example, when the number of constituent codes is six (6) (i.e., k=6), a 1$^{st}$ diagonal matrix group $G_1$ may be set to sequentially include message blocks $B_{1,2}$, $B_{2,3}$, $B_{3,4}$, $B_{4,5}$ and $B_{5,6}$ of the 2$^{nd}$ diagonal matrix, and $B_{1,6}$ of the 6$^{th}$ diagonal matrix according to the priority order. Accordingly, when the number of constituent codes is six (6) (i.e., k=6) and "i" is one (1), the $1^{st}$, $3^{rd}$ and $5^{th}$ message blocks may be included in the $1^{st}$ sequence group and $2^{nd}$, $4^{th}$ and $6^{th}$ message blocks may be included in the $2^{nd}$ sequence group in the $1^{st}$ diagonal matrix group $G_1$. When the number of constituent codes is six (6) (i.e., k=6) and "i" is two (2), the $1^{st}$, $2^{nd}$, $4^{th}$ and $6^{th}$ message blocks may be included in the $1^{st}$ sequence group and $3^{rd}$ and $5^{th}$ message blocks may be included in the $2^{nd}$ sequence group in the $2^{nd}$ diagonal matrix group $G_2$. In other words, message blocks $B_{1,2}$, $B_{3,4}$ and $B_{5,6}$ may be sequentially included in the $1^{st}$ sequence group and message blocks $B_{2,3}$, $B_{4,5}$ and $B_{1,6}$ may be sequentially included in the $2^{nd}$ sequence group in the $1^{st}$ diagonal matrix group $G_1$ according to the priority order, message blocks $B_{1,3}$, $B_{2,4}$, $B_{1,5}$ and $B_{2,6}$ may be sequentially included in the $1^{st}$ sequence group and message blocks $B_{3,5}$ and $B_{4,6}$ may be sequentially included in the $2^{nd}$ sequence group in the $2^{nd}$ diagonal matrix group $G_2$ according to the priority order.

At step S420, the controller 120 may select "γ" numbers of message blocks among the message blocks included in the $1^{st}$ and $2^{nd}$ sequence groups such that the message blocks included in the $1^{st}$ sequence group are selected prior to the message blocks included in the $2^{nd}$ sequence group.

To summarize setting sizes of the respective message blocks $B_{i,j}$ included in the upper triangular matrix A of the message matrix MM described with reference to FIGS. 3 and 4, the controller 120 may select "β" numbers of message blocks by selecting message blocks in order of the $(i)^{th}$ diagonal matrix group $G_i$. When selecting message blocks in the $(i)^{th}$ diagonal matrix group $G_i$, the controller 120 may select $(2*(n-1)*i+1)^{th}$ to $((2n-1)*i)^{th}$ message blocks prior to $((2n-1)*i+1)^{th}$ to $(2n*i)^{th}$ message blocks among the message blocks included in the $(i)^{th}$ diagonal matrix group $G_i$. When "k" is even and "β" satisfies equation 3, the controller 120 may select "γ" numbers of message blocks in the $(k/2)^{th}$ diagonal matrix group.

Figure 5:
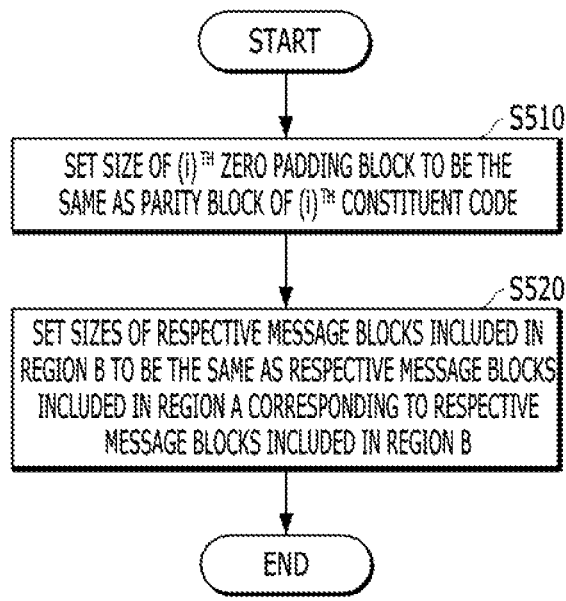
FIG. 5 is a flowchart illustrating an operation of setting sizes of respective message blocks included in a zero-padding block and a lower triangular matrix of the message matrix.

FIG. 5 is a flowchart illustrating an operation of setting sizes of respective message blocks $B_{i,j}$ included in the zero-padding block and the lower triangular matrix B of the message matrix MM.

At step S510, the controller 120 may set the size "$n_B$" of the $(i)^{th}$ message block $B_{i,j}$ to have the same value as the $(i)^{th}$ parity block $R_i$.

At step S520, the controller 120 may set the size "$n_B$" of each message block $B_{i,j}$ included in the lower triangular matrix B to have the same value as each message block $B_{j,i}$ included in the upper triangular matrix A. As described above, the message block $B_{j,i}$ included in the upper triangular matrix A may correspond to the message block $B_{i,j}$ included in the lower triangular matrix B.

In such matrix, differences in the length of each constituent code may be reduced since message blocks having the size "$n_B$" of "α+1" are effectively located in such matrix. Accordingly, the error correction capability of the SBC-BCH code may be improved.

Further, because the size "$n_B$" of each zero-padding block $B_{i,j}$ is set to have the same value as the $(i)^{th}$ parity block $R_i$, the error floor and the overlap problem occurring when decoding a codeword by utilizing the Collaborative Decoding Algorithm (CDA) may also be improved. Meanwhile, the zero-padding block may not be utilized. Further, even when the zero-padding block is utilized, the zero-padding block may be the predetermined data and thus the write operation and transfer operation to the zero-padding block may not be substantially performed.

Figure 6:
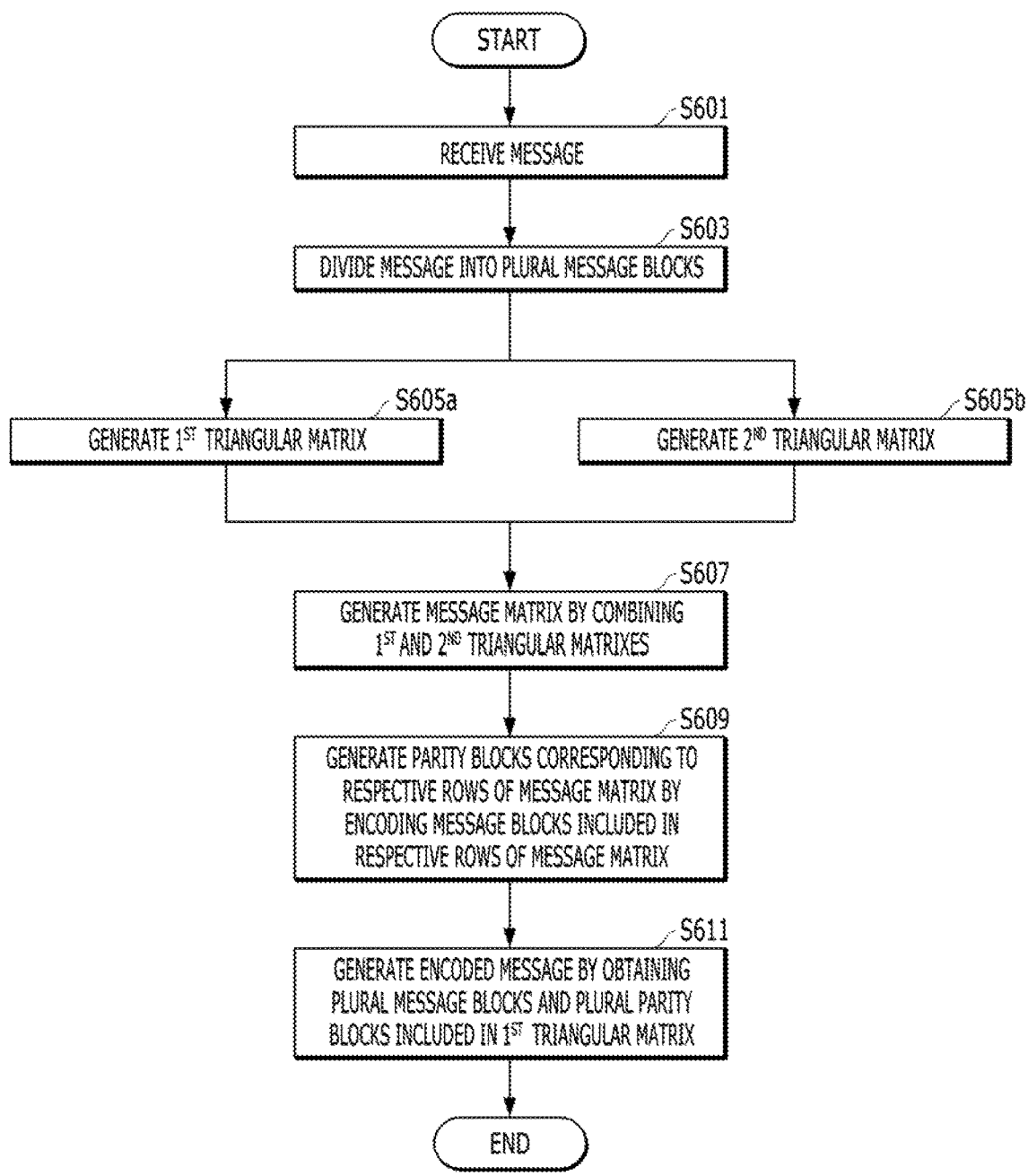
FIG. 6 is a flowchart illustrating an encoding operation of a memory system, in accordance with an embodiment of the present invention.

FIG. 6 is a flowchart Illustrating an encoding operation of a memory system, in accordance with an embodiment of the present invention.

At step S601, the controller 120 may receive a message from the host 100.

At step S603, the controller 120 may divide the message into a plurality of message blocks according to a designed code.

At step S605A, the controller 120 may generate a $1^{st}$ triangular matrix by using the plurality of message blocks. The $1^{st}$ triangular matrix may be one of the upper triangular matrix A and the lower triangular matrix B.

At step S605B, the controller 120 may generate a $2^{nd}$ triangular matrix by using the plurality of message blocks. The $2^{nd}$ triangular matrix may be symmetrical to the $1^{st}$ triangular matrix. That is, when the $1^{st}$ triangular matrix is the upper triangular matrix A, the $2^{nd}$ triangular matrix may be the lower triangular matrix B.

At step S607, the controller 120 may generate a single message matrix MM by combining the $1^{st}$ triangular matrix and the $2^{nd}$ triangular matrix. The message matrix MM may have an anti-symmetric structure or a reduced structure. The message matrix MM having the anti-symmetric structure may have the $1^{st}$ and $2^{nd}$ triangular matrixes and a plurality of zero-padding blocks, each of zero-padding blocks is padded with zero-valued bits, on the diagonal boundary between the $1^{st}$ triangular matrix and the $2^{nd}$ triangular matrix in the message matrix MM. The message matrix MM having the reduced structure may have the $1^{st}$ triangular matrix and the $2^{nd}$ triangular matrix without the zero-padding blocks. That is, the message matrix MM having the reduced structure may not have the plurality of zero-padding blocks, each of which is padded with zero-valued bits, on the diagonal boundary between the $1^{st}$ triangular matrix and the $2^{nd}$ triangular matrix. The message matrix having the anti-symmetric structure may now be taken as an example in this disclosure.

At step S609, the controller 120 may generate parity blocks corresponding to the respective rows of the message matrix MM by performing the encoding operation to the message blocks included in the respective rows of the message matrix MM. The message blocks included in the respective rows of the message matrix MM and the parity blocks generated for the respective rows of the message matrix MM may form the constituent codes for the respective rows of the message matrix MM. The parity blocks generated for the respective rows of the message matrix MM may form the parity matrix PM of FIG. 2.

At step S611, the controller 120 may complete the encoding operation by extracting from the encoded message matrix MM the plurality of message blocks and the plurality of parity blocks included in the $1^{st}$ triangular matrix. The reason of generating an encoded message by extracting from the encoded message matrix MM the plurality of message blocks and the plurality of parity blocks included in the $1^{st}$ triangular matrix may be that a plurality of message blocks included in the $2^{nd}$ triangular matrix are symmetrical to those included in the $1^{st}$ triangular matrix.

Figure 7:
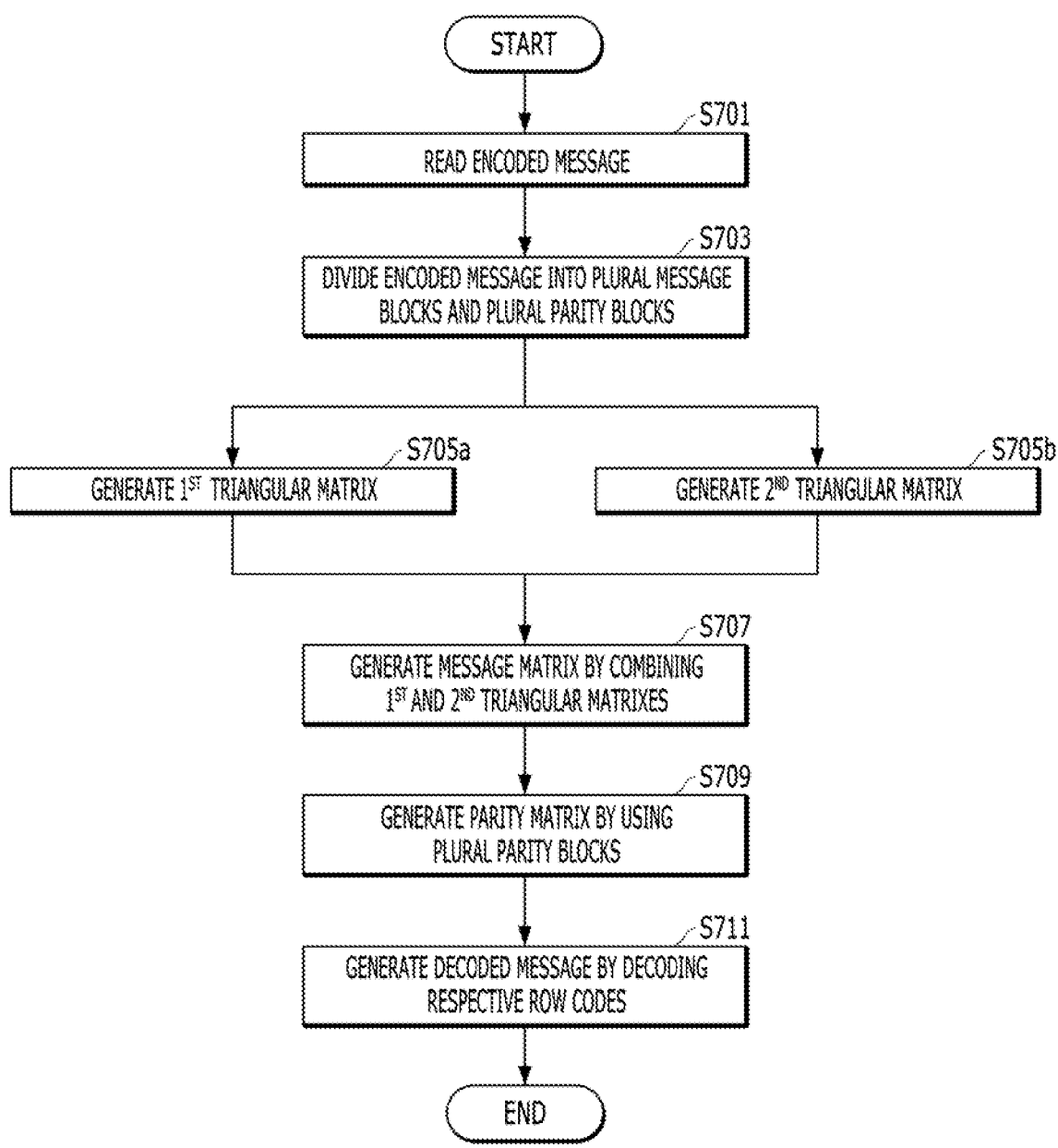
FIG. 7 is a flowchart illustrating a decoding operation of a memory system, in accordance with an embodiment of the present invention.

FIG. 7 is a flowchart illustrating a decoding operation of a memory system, in accordance with an embodiment of the present invention.

At step S701, the controller 120 may receive a command from the host 100, and may perform the read operation to the memory device 130 by reading the encoded message.

At step S703, the controller 120 may divide the encoded message into a plurality of encoded message blocks and a plurality of parity blocks according to a designed matrix.

At step S705a, the controller 120 may generate a 1$^{st}$ triangular matrix by using the plurality of encoded message blocks.

At step S705b, the controller 120 may generate a 2$^{nd}$ triangular matrix by using the plurality of encoded message blocks. The 2$^{nd}$ triangular matrix may be symmetrical to the 1$^{st}$ triangular matrix. In an embodiment, the 1$^{st}$ triangular matrix and the 2$^{nd}$ triangular matrix may be generated at the same time. In another embodiment, the 2$^{nd}$ triangular matrix may be generated after the 1$^{st}$ triangular matrix is generated. In another embodiment, the 1$^{st}$ triangular matrix may be generated after the 2$^{nd}$ triangular matrix is generated.

At step S707, the controller 120 may generate a single message matrix by combining the 1$^{st}$ triangular matrix and the 2$^{nd}$ triangular matrix. The message matrix may have the anti-symmetric structure or the reduced structure. The anti-symmetric structure and the reduced structure were described above with reference to step S607 and thus the description thereof will be omitted. The message matrix having the anti-symmetric structure may be taken as an example in this disclosure.

At step S709, the controller 120 may generate a parity matrix PM by using the plurality of parity blocks.

At step S711, the controller 120 may generate a decoded message by performing the decoding operation to the respective row codes of the message matrix MM and the parity matrix PM. That is, the controller 120 may generate the decoded message by performing the decoding operation to the plurality of encoded message blocks included in the respective rows of the message matrix MM and the plurality of parity blocks included in the respective rows of the parity matrix PM.

Figure 8:
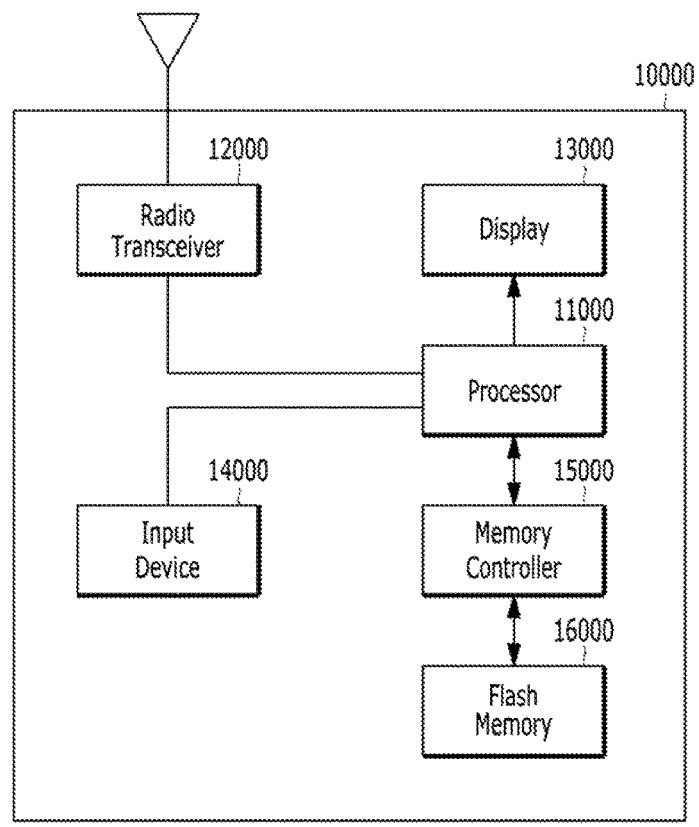
FIG. 8 illustrates an electronic device including a memory controller and a flash memory, according to an embodiment of the present invention.

FIG. 8 illustrates an electronic device 10000 including a memory controller 15000 and a flash memory 16000, according to an embodiment of the present invention. The electronic device 10000 may be or include, for example, a cellular phone, a smart phone, or a tablet PC.

According to the embodiment of FIG. 8, the electronic device 10000 may include the flash memory 16000 which may be implemented by a flash memory device and the memory controller 15000 for controlling the flash memory 16000. The flash memory 16000 may correspond to the memory device 200 of the memory system 110 of FIG. 1. The flash memory 16000 may store random data. The memory controller 15000 may be controlled by a processor 11000 which controls the overall operations of the electronic device 10000.

Data stored in the flash memory 16000 may be displayed through a display 13000 under the control of the memory controller 15000. The memory controller 15000 may operate under the control of the processor 11000.

A radio transceiver 12000 may receive and output a radio signal through an antenna (ANT). For example, the radio transceiver 12000 may convert a radio signal received from the antenna into a signal which is processed by the processor 11000. The processor 11000 may the process the converted signal received by the radio transceiver 12000, and may store the processed signal in the flash memory 16000. The processor 11000 may display the processed signal through the display 13000.

The radio transceiver 12000 may convert a signal from the processor 11000 into a radio signal, and may output the converted radio signal externally through the antenna.

An input device 14000 may receive a control signal for controlling an operation of the processor 11000 or data to be processed by the processor 11000. The input device 14000 may be or include a pointing device, such as, for example, a touch pad, a computer mouse, a key pad, and a keyboard.

The processor 11000 may control the display 13000 so that data from the flash memory 16000, the radio signal from the radio transceiver 12000, or the data from the input device 14000 is displayed through the display 13000.

Figure 9:
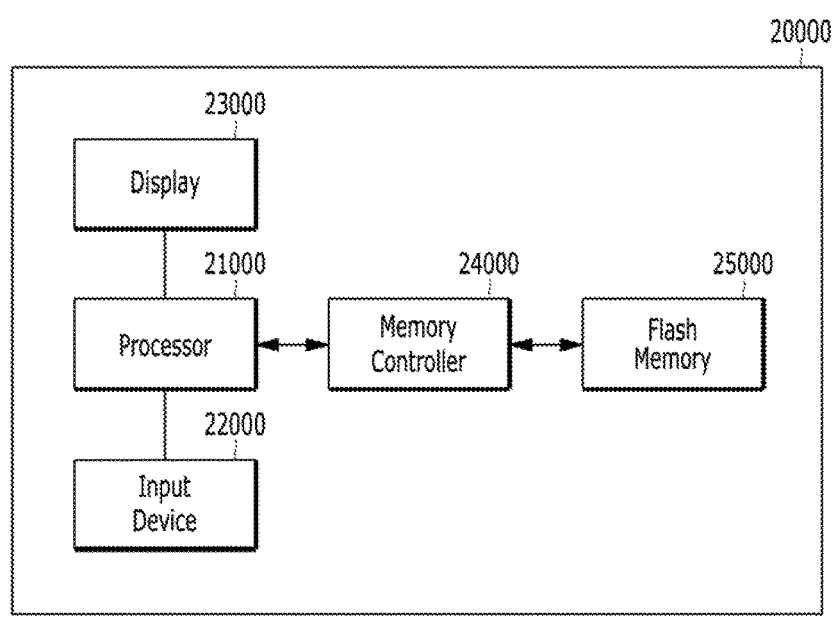
FIG. 9 illustrates an electronic device including a memory controller and a flash memory, according to another embodiment of the present invention.

FIG. 9 illustrates an electronic device 20000 including a memory controller 24000 and a flash memory 25000, according to an embodiment of the present invention.

According to the embodiment of FIG. 9, the electronic device 20000 may be implemented by a data processing device, such as a personal computer (PC), a tablet computer, a net-book, an e-reader, a personal digital assistant (PDA), a portable multimedia player (PMP), an MP3 player, and an MP4 player, and may include the flash memory 25000 as a memory device, and the memory controller 24000 to control an operation of the flash memory 25000.

The electronic device 20000 may include a processor 21000 to control the overall operations of the electronic device 20000. The memory controller 24000 may be controlled by the processor 21000.

The processor 21000 may display data stored in the flash memory 25000 through a display 23000 in response to an input signal from an input device 22000. For example, the input device 22000 may be implemented by a pointing device such as, for example, a touch pad, a computer mouse, a key pad, and a keyboard.

Figure 10:
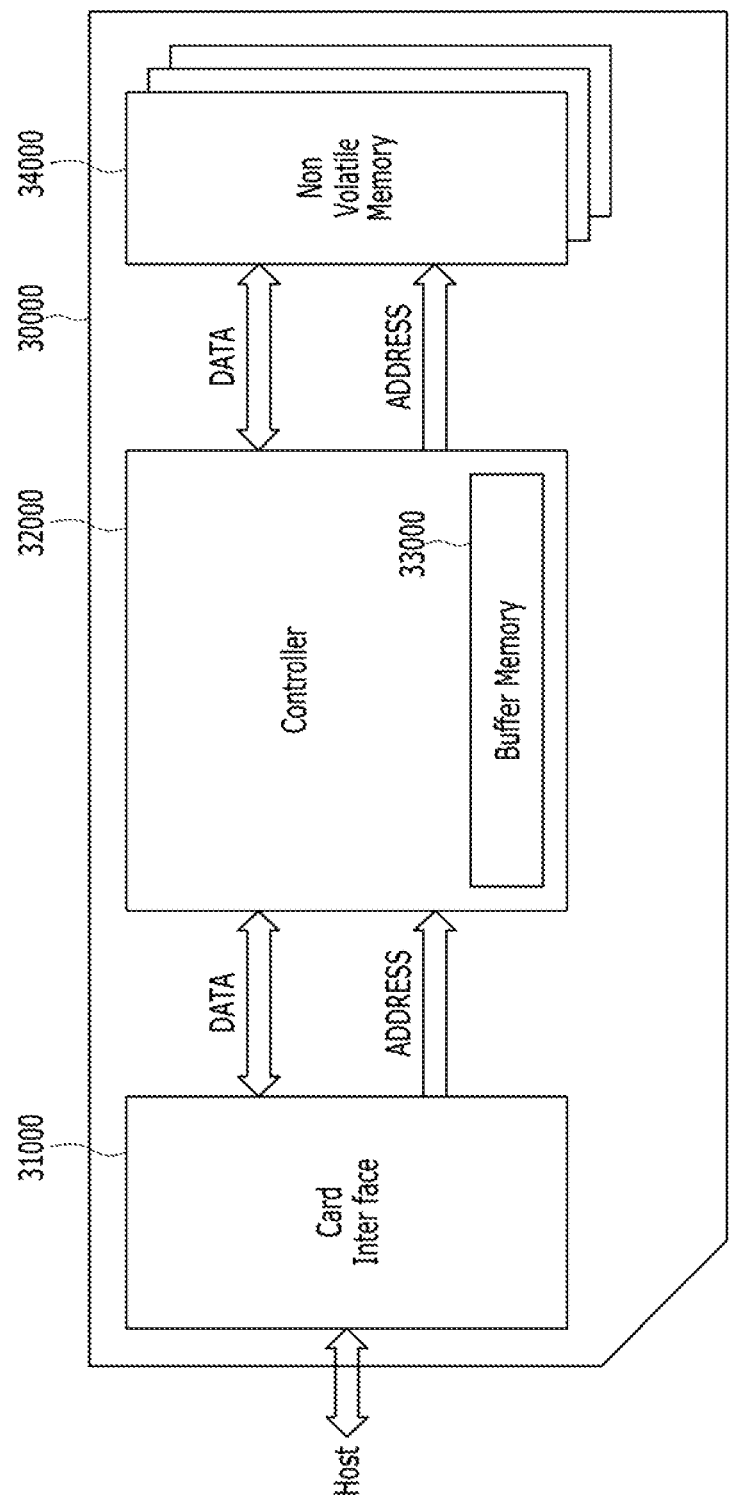
FIG. 10 illustrates an electronic device including a controller and a non-volatile memory, according to yet another embodiment of the present invention.

FIG. 10 illustrates an electronic device 30000 including a controller 32000 and a non-volatile memory 34000, according to an embodiment of the present invention.

Referring to FIG. 10, the electronic device 30000 may include a card interface 31000, the controller 32000, and the non-volatile memory 34000 which may be, for example, a flash memory device.

The electronic device 30000 may exchange data with a host through the card interface 31000. The card interface 31000 may interface the host and the controller 32000 according to a communication protocol of the host that is capable of communicating with the electronic device 30000. The card interface 31000 may be any suitable card interface, and may be, for example, a secure digital (SD) card Interface or a multi-media card (MMC) interface.

The controller 32000 may control the overall operations of the electronic device 30000 including data exchange between the card interface 31000 and the non-volatile memory 34000. A buffer memory 33000 of the controller 32000 may buffer data transferred between the card interface 31000 and the non-volatile memory 34000.

The controller 32000 may be coupled with the card interface 31000 and the non-volatile memory 34000 through a data bus DATA and an address bus ADDRESS. The controller 32000 may receive an address of data, which is to be read or written, from the card Interface 31000 through the address bus ADDRESS, and may send it to the non-volatile memory 34000. Further, the controller 32000 may receive or transfer data to be read or written through the data bus DATA connected with the card interface 31000 or the non-volatile memory 34000.

When the electronic device 30000 is connected with the host the host may exchange data with the non-volatile memory 34000 through the card interface 31000 and the controller 32000. The host may be any suitable device, such as, for example, a PC, a tablet PC, a digital camera, a digital audio player, a mobile phone, console video game hardware, and a digital set-top box.

While the present invention has been described with respect to specific embodiments, it will be apparent to those skilled in the art to which the present invention pertains that various changes and modifications may be made without departing from the spirit and scope of the invention as defined in the following claims.

Also, in some instances, as would be apparent to those skilled in the relevant art, a feature or element described in connection with one embodiment may be used singly or in combination with other features or elements of another embodiment, unless otherwise specifically indicated.

What is claimed is:

1. An operating method of a memory system including a controller and a memory device, the operating method comprising:
   receiving a message from a host by the controller;
   generating a square message matrix of k×k based on the message by the controller;
   minimizing a length of each codes included in the square message matrix;
   generating an encoded message by the controller which encodes the square message matrix row by row through a Bose-Chadhuri-Hocquenghem (BCH) code; and
   storing the encoded message in the memory device; and
   obtaining the encoded message in the memory device by the controller for decoding,
   wherein the square message matrix includes an upper triangular matrix and a lower triangular matrix, which are symmetrical to each other with reference to zero-padding blocks included in a diagonal direction in the square message matrix,
   wherein the upper triangular matrix includes "β" numbers of message blocks, each of which has a size of "α+1", and "(N−β)" numbers of message blocks, each of which has a size of "α", and
   wherein "α", "β" and N have relationships represented by equations $$\alpha = \left\lfloor \frac{M}{N} \right\rfloor$$
$$\beta = M \bmod N$$

where "M" represents a size of the message input from the host and "N" represents a number of message blocks forming the upper triangular matrix,
   wherein the generating of the encoded message includes generating a parity block for each row of the square message matrix, and
   wherein each size of the zero-padding blocks is the same as the parity block.

2. The operating method of claim 1,
   wherein the generating of the encoded message includes selecting the "β" numbers of message blocks from message blocks included in an (i)$^{th}$ diagonal matrix group according to a sequential priority of the message blocks included in the (i)$^{th}$ diagonal matrix group,
   wherein the (i)$^{th}$ diagonal matrix group includes a (i+1)$^{th}$ diagonal matrix and a (k+1−i)$^{th}$ diagonal matrix, and
   wherein the "i" and "k" have a relationship represented by following equation-31

$$1 \leq i \leq \left\lfloor \frac{k}{2} \right\rfloor$$

where "i" and "k" are integers.

3. The operating method of claim 2,
   wherein the message blocks included in the (i)$^{th}$ diagonal matrix group have the sequence such that a message block included in the (i+1)$^{th}$ diagonal matrix has a sequentially higher priority than a message block included in the (k+1−i)$^{th}$ diagonal matrix, and such that a message block of higher row has a sequentially higher priority in a diagonal matrix, and
   wherein the generating of the encoded message includes, when the "β" numbers of message blocks are selected from the (i)$^{th}$ diagonal matrix group, selecting (2*(n−1)*i+1)$^{th}$ to ((2n−1)*i)$^{th}$ message blocks prior to ((2n−1)*i+1)$^{th}$ to (2n*i)$^{th}$ message blocks among message blocks included in the (i)$^{th}$ diagonal matrix group, where "n" is an integer greater than one (1).

4. The operating method of claim 3,
   wherein the generating of the encoded message includes selecting "γ" numbers of message blocks among the "β" numbers of message blocks from a (k/2)$^{th}$ diagonal matrix group when the "k" is even and the "β" satisfies following equation, $$\beta \bmod k \leq \frac{k}{2}$$

and
   wherein the "γ", "β" and "k" have a relationship represented by following equation $$\beta \bmod k \leq \frac{k}{2}$$
$$\gamma = \beta \bmod k.$$

5. A memory system comprising:
   a controller suitable for receiving a message from a host; and
   a memory device suitable for storing an encoded message;
   wherein the controller includes:
   an error correction code (ECC) circuit suitable for generating a square message matrix of k×k by using the message, minimizing a length of each codes included in the square message matrix, and generating the encoded message by encoding the square message matrix row by row through a Bose-Chadhuri-Hocquenghem (BCH) code; and
   a processor suitable for providing the encoded message to the memory device and obtaining the encoded message in the memory device for decoding,
   wherein the square message matrix includes an upper triangular matrix and a lower triangular matrix, which are symmetrical to each other with reference to zero-padding blocks included in a diagonal direction in the square message matrix,
   wherein the upper triangular matrix includes "β" numbers of message blocks, each of which has a size of "α+1", and "(N−β)" numbers of message blocks, each of which has a size of "α", and
   wherein the "α", "β" and "N" have relationships represented by following equations $$\alpha = \left\lfloor \frac{M}{N} \right\rfloor$$

-continued $$\beta = M \bmod N$$

where the "M" represents a size of the message input from the host and the "N" represents a number of message blocks forming the upper triangular matrix,
wherein the error correction code (ECC) circuit further generates a parity block for each row of the square message matrix, and
wherein each size of the zero-padding blocks has the same as the parity block.

6. The memory system of claim 5,
wherein the error correction code (ECC) circuit selects the "β" numbers of message blocks from message blocks included in an (i)$^{th}$ diagonal matrix group according to a sequential priority of the message blocks included in the (i)$^{th}$ diagonal matrix group,
wherein the (i)$^{th}$ diagonal matrix group includes a (i+1)$^{th}$ diagonal matrix and a (k+1−i)$^{th}$ diagonal matrix, and
wherein the "i" and "k" have a relationship represented by following equation $$1 \le i \le \left\lfloor \frac{k}{2} \right\rfloor$$

where "i" and "k" are integers.

7. The memory system of claim 6,
wherein the message blocks included in the (i)$^{th}$ diagonal matrix group have the sequence such that a message block included in the (i+1)$^{th}$ diagonal matrix has a sequentially higher priority than a message block included in the (k+1−i)$^{th}$ diagonal matrix, and such that a message block of higher row has a sequentially higher priority in a diagonal matrix, and
wherein the error correction code (ECC) circuit selects, when the "β" numbers of message blocks are selected from the (i)$^{th}$ diagonal matrix group, (2*(n−1)*i+1)$^{th}$ to ((2n−1)*i)$^{th}$ message blocks prior to ((2n−1)*i+1)$^{th}$ to (2n*i)$^{th}$ message blocks among message blocks included in the (i)$^{th}$ diagonal matrix group, where "n" is an integer greater than one (1).

8. The memory system of claim 7,
wherein the error correction code (ECC) circuit selects "γ" numbers of message blocks among the "β" numbers of message blocks from a (k/2)$^{th}$ diagonal matrix group when the "k" is even and the "β" satisfies following equation, $$\beta \bmod k \le \frac{k}{2}$$

and
wherein the "γ", "β" and "k" have a relationship represented by following equation $$\beta \bmod k \le \frac{k}{2}$$
$$\gamma = \beta \bmod k.$$

9. An operating method of a memory system including a controller and a memory device, the operating method comprising:
reading from the memory device, by the controller, an encoded message including a square message matrix of k×k;
generating, by the controller, a decoded message by decoding the square message matrix row by row through a Bose-Chadhuri-Hocquenghem (BCH) code; and
providing, by the controller, the decoded message to a host,
wherein the square message matrix includes an upper triangular matrix and a lower triangular matrix, which are symmetrical to each other with reference to zero-padding blocks included in a diagonal direction in the square message matrix,
wherein the upper triangular matrix includes "β" numbers of message blocks, each of which has a size of "α+1", and "(N−β)" numbers of message blocks, each of which has a size of "α", and
wherein "α", "β" and N have relationships represented by following equations $$\alpha = \left\lfloor \frac{M}{N} \right\rfloor$$
$$\beta = M \bmod N$$

where "M" represents a size of the encoded message and "N" represents a number of message blocks forming the upper triangular matrix, and
wherein a length of each codes included in the squared message matrix is minimized and each size of the zero-padding blocks is the same as a parity block for each row of the square message matrix.

10. The operating method of claim 9,
wherein the generating of the decoded message includes selecting the "β" numbers of message blocks from message blocks included in an (i)$^{th}$ diagonal matrix group according to a sequential priority of the message blocks included in the (i)$^{th}$ diagonal matrix group,
wherein the (i)$^{th}$ diagonal matrix group includes a (i+1)$^{th}$ diagonal matrix and a (k+1−i)$^{th}$ diagonal matrix, and
wherein the "i" and "k" have a relationship represented by following equation $$1 \le i \le \left\lfloor \frac{k}{2} \right\rfloor$$

where "i" and "k" are integers.

11. The operating method of claim 10,
wherein the message blocks included in the (i)$^{th}$ diagonal matrix group have the sequence such that a message block included in the (i+1)$^{th}$ diagonal matrix has a sequentially higher priority than a message block included in the (k+1−i)$^{th}$ diagonal matrix, and such that a message block of higher row has a sequentially higher priority in a diagonal matrix, and
wherein the generating of the encoded message includes, when the "β" numbers of message blocks are selected from the (i)$^{th}$ diagonal matrix group, selecting (2*(n−1)*i+1)$^{th}$ to ((2n−1)*i)$^{th}$ message blocks prior to ((2n−1)*i+1)$^{th}$ to (2n*i)$^{th}$ message blocks among message blocks included in the (i)$^{th}$ diagonal matrix group, where "n" is an integer greater than one (1).

12. The operating method of claim 11,
wherein the generating of the decoded message includes selecting "γ" numbers of message blocks among the "β" numbers of message blocks from a (k/2)$^{th}$ diagonal matrix group when the "k" is even and the "β" satisfies following equation, $$\beta \bmod k \le \frac{k}{2}$$

and
wherein the "γ", "β" and "k" have a relationship represented by following equation $$\beta \bmod k \le \frac{k}{2}$$
$$\gamma = \beta \bmod k.$$

13. A memory system comprising:
a memory device suitable for storing an encoded message; and
a controller suitable for reading the encoded message, decoding the encoded message and providing a decoded message to a host;
wherein the controller includes:
an error correction code (ECC) circuit suitable for reading from the memory device the encoded message including a square message matrix of k×k, and generating the decoded message by decoding the square message matrix row by row through a Bose-Chadhuri-Hocquenghem (BCH) code; and
a processor suitable for providing the decoded message to the host,
wherein the square message matrix includes an upper triangular matrix and a lower triangular matrix, which are symmetrical to each other with reference to zero-padding blocks included in a diagonal direction in the square message matrix,
wherein the upper triangular matrix includes "β" numbers of message blocks, each of which has a size of "α+1", and "(N−β)" numbers of message blocks, each of which has a size of "α", and
wherein the "α", "β" and "N" have relationships represented by following equations $$\alpha = \left\lfloor \frac{M}{N} \right\rfloor$$
$$\beta = M \bmod N$$

where the "M" represents a size of the encoded message and the "N" represents a number of message blocks forming the upper triangular matrix, and
wherein a length of each codes included in the squared message matrix is minimized and each size of the zero-padding blocks is the same as a parity block for each row of the square message matrix.

14. The memory system of claim 13,
wherein the error correction code (ECC) circuit selects the "β" numbers of message blocks from message blocks included in an (i)$^{th}$ diagonal matrix group according to a sequential priority of the message blocks included in the (i)$^{th}$ diagonal matrix group,
wherein the (i)$^{th}$ diagonal matrix group includes a (i+1)$^{th}$ diagonal matrix and a (k+1−i)$^{th}$ diagonal matrix, and
wherein the "i" and "k" have a relationship represented by following equation $$1 \le i \le \left\lfloor \frac{k}{2} \right\rfloor$$

where "i" and "k" are integers.

15. The memory system of claim 14,
wherein the message blocks included in the (i)$^{th}$ diagonal matrix group have the sequence such that a message block included in the (i+1)$^{th}$ diagonal matrix has a sequentially higher priority than a message block included in the (k+1−i)$^{th}$ diagonal matrix, and such that a message block of higher row has a sequentially higher priority in a diagonal matrix, and
wherein the error correction code (ECC) circuit selects, when the "β" numbers of message blocks are selected from the (i)$^{th}$ diagonal matrix group, (2*(n−1)*i+1)$^{th}$ to ((2n−1)*i)$^{th}$ message blocks prior to ((2n−1)*i+1)$^{th}$ to (2n*i)$^{th}$ message blocks among message blocks included in the (i)$^{th}$ diagonal matrix group, where "n" is an integer greater than one (1).

16. The memory system of claim 15,
wherein the error correction code (ECC) circuit selects "γ" numbers of message blocks among the "β" numbers of message blocks from a (k/2)$^{th}$ diagonal matrix group when the "k" is even and the "β" satisfies following equation 4, $$\beta \bmod k \le \frac{k}{2}$$

and
wherein the "γ", "β" and "k" have a relationship represented by following equation $$\beta \bmod k \le \frac{k}{2}$$
$$\gamma = \beta \bmod k.$$

* * * * *